United States Patent
Chang (10) Patent No.: US 9,247,631 B2
(45) Date of Patent: Jan. 26, 2016

(54) METHOD FOR FABRICATING HEAT DISSIPATION SUBSTRATE

(75) Inventor: Chen-Chuan Chang, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 1045 days.

(21) Appl. No.: 13/352,553

(22) Filed: Jan. 18, 2012

(65) Prior Publication Data

US 2012/0255165 A1 Oct. 11, 2012

(30) Foreign Application Priority Data

Apr. 8, 2011 (TW) .............................. 100112238 A (51) Int. Cl.
| | |
|---|---|
| H01K 3/10 | (2006.01) |
| H05K 1/02 | (2006.01) |
| H01L 33/64 | (2010.01) |
| H05K 3/02 | (2006.01) |
| H05K 3/40 | (2006.01) |

(52) U.S. Cl.
CPC ............ *H05K 1/0204* (2013.01); *H01L 33/644* (2013.01); *H05K 3/022* (2013.01); *H01L 33/642* (2013.01); *H05K 3/4046* (2013.01); *H05K 2201/066* (2013.01); *H05K 2201/10106* (2013.01); *H05K 2201/10416* (2013.01); *H05K 2203/0323* (2013.01); *H05K 2203/061* (2013.01); *H05K 2203/063* (2013.01); *Y10T 29/49124* (2015.01); *Y10T 29/49126* (2015.01)

(58) Field of Classification Search
CPC ................ H05K 1/0204; H05K 3/022; H05K 2201/10106; H05K 2201/10416; H05K 2201/066; H05K 2203/061; H05K 2203/0323; H05K 2203/063; H01L 33/644; Y10T 29/49126; Y10T 29/49124
See application file for complete search history.

(56) References Cited

U.S. PATENT DOCUMENTS

| 6,396,143 | B1 * | 5/2002 | Kimbara et al. .............. 257/712 |
| 8,354,598 | B2 | 1/2013 | Liu | |
| 2007/0018312 | A1 | 1/2007 | Jo | |
| 2010/0051331 | A1 * | 3/2010 | Tsai et al. ..................... 174/256 |

FOREIGN PATENT DOCUMENTS

| CN | 201247772 Y | 5/2009 |
| TW | 200942762 A | 10/2009 |

* cited by examiner

*Primary Examiner* — Peter DungBa Vo
*Assistant Examiner* — Jeffrey T Carley
(74) *Attorney, Agent, or Firm* — Alan D. Kamrath; Kamrath IP Lawfirm, P.A.

(57) ABSTRACT

A method, for fabricating a heat dissipation substrate, includes the steps of: providing a substrate, with the substrate including a metal layer, an insulation layer, and a first conductive layer, with the insulation layer positioned between the metal layer and the first conductive layer, and with the metal layer thicker than the first conductive layer; removing part of the metal layer for forming a metal bulk; providing an adhesive layer including an opening, with the opening corresponding to the metal bulk; providing a second conductive layer; laminating the second conductive layer, the adhesive layer and the substrate; forming a hole in the insulation layer and the first conductive layer, with the hole positioned under the metal bulk; and forming a third conductive layer in the hole.

10 Claims, 8 Drawing Sheets

METHOD FOR FABRICATING HEAT DISSIPATION SUBSTRATE

BACKGROUND OF THE INVENTION

1. Field of the Invention

The present invention relates to a method for fabricating a circuit board. More particularly, the present invention relates to a method for fabricating a heat dissipation substrate.

2. Description of the Related Art

A chip generates heat in operation, and a chip with better performance generates more heat. However, excessive heat may cause overheating. If the heat cannot be dissipated quickly, the chip will not be able to work normally, or be damaged permanently. Furthermore, overheating may cause the packaging material and the circuit board to have different degrees of thermal expansion, such that the interface of different material will be broken, or the intensity of electrical connections of the elements and the circuit board will be impacted, allowing the product to crash.

To solve the abovementioned problem, a chip package carrier with a heat dissipation structure is developed to prevent overheating. In one of the prior art for heat dissipation, a heat dissipation lump (such as a copper block or a ceramics block) is first placed on a copper substrate, then, the insulation substrate (such as a polypropylene substrate), which includes a hole corresponding to the heat dissipation lump, is combined with the copper substrate which includes the heat dissipation lump, and, finally, another copper substrate is pasted on the other face of the insulation substrate. The heat dissipation lump is connected to the other copper substrate through the hole, and a follow-up process (such as the lithography and the etching) is executed. When the chip is placed on the copper substrate, the heat generated by the chip can be delivered to the other copper substrate for heat dissipation via the heat dissipation lump. However, in the abovementioned method, every step must be executed in alignment, and that may cause errors in alignment. The copper or ceramic block is formed by a mechanical treatment, but the mechanical treatment is difficult, and the yield rate is low. In addition, the thermal expansion coefficient of the ceramic block is quite different from those of the copper and the insulation. If the ceramic block, copper, and the insulation substrate undergo thermal expansion, the difference in degree of expansion will seriously distort the heat dissipation structure and make it stratified.

In another prior art for heat dissipation, a laser drilling process is used to form a plurality of laser holes on the substrate, and the holes are filled with thermally conductive material. When the chip is placed on the copper substrate, the heat generated by the chip can be delivered to the other face (such as the copper substrate) for heat dissipation via the thermally conductive material in the plurality of laser holes. However, the diameter of the laser hole is very small, and the heat dissipation performance is worse than the heat dissipation lump. Increasing the diameter of the laser holes to enhance the heat dissipation performance would greatly increase the cost in money and time.

Therefore, there is a need to provide a method for fabricating a heat dissipation substrate to solve the abovementioned problems.

SUMMARY OF THE INVENTION

It is an object of the present invention to provide a method for fabricating a heat dissipation substrate.

The method for fabricating a heat dissipation substrate of the present invention includes the steps of: providing a substrate, with the substrate including a metal layer, an insulation layer, and a first conductive layer, with the insulation layer positioned between the metal layer and the first conductive layer, and with the metal layer thicker than the first conductive layer; removing part of the metal layer for forming a metal bulk; providing an adhesive layer including an opening, with the opening corresponding to the metal bulk; providing a second conductive layer; laminating the second conductive layer, the adhesive layer and the substrate, with the adhesive layer positioned between the second conductive layer and the substrate; forming a hole in the insulation layer and the first conductive layer, with the hole positioned under the metal bulk, and with part of the lower surface exposed; and forming a third conductive layer in the hole.

In one embodiment of the present invention, the thickness of the metal layer is substantially between 38 and 65 micrometers. In one embodiment of the present invention, the thickness of the insulation layer is substantially between 5 and 25 micrometers. In one embodiment of the present invention, the thickness of the first conductive layer is substantially between 10 and 38 micrometers.

In one embodiment of the present invention, the metal bulk includes an upper surface and a lower surface. The lower surface is connected to the insulation layer, and the area of the lower surface is larger than the area of the upper surface. The ratio value range of the area of the upper surface to the area of the lower surface is substantially between 25% and 95%.

DETAILED DESCRIPTION OF THE PREFERRED EMBODIMENTS

These and other objects and advantages of the present invention will become apparent from the following description of the accompanying drawings, which disclose several embodiments of the present invention. It is to be understood that the drawings are to be used for purposes of illustration only, and not as a definition of the invention.

The schematic drawings of the embodiments of the present invention are all simplified to show the method for fabricating a heat dissipation substrate of the present invention. The elements shown in the schematic drawing are not the actual figure and configuration in implementation, the number, shape, and size of the elements are designed selectively, and the arrangement of the elements can be more complicated.

Figure 1:
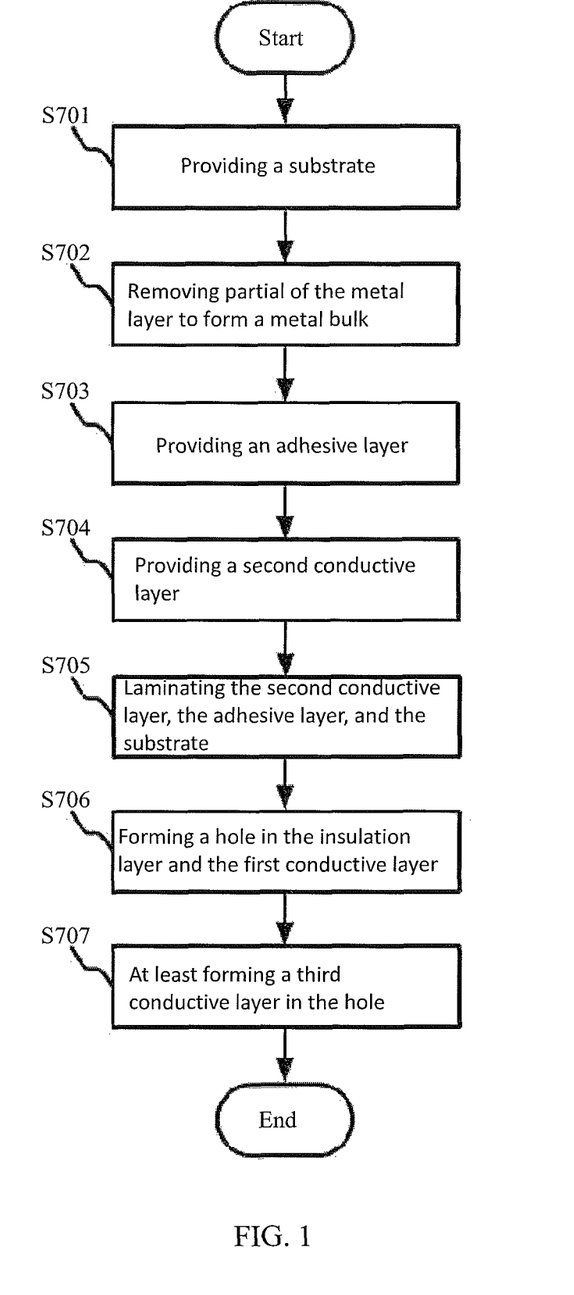
FIG. 1 illustrates a flowchart of the method for fabricating a heat dissipation substrate in one embodiment of the present invention.

Please refer to FIG. 1, which illustrates a flowchart of the method for fabricating a heat dissipation substrate in one embodiment of the present invention.

For the method for fabricating a heat dissipation substrate, execute Step S701: providing a substrate.

Figure 2:
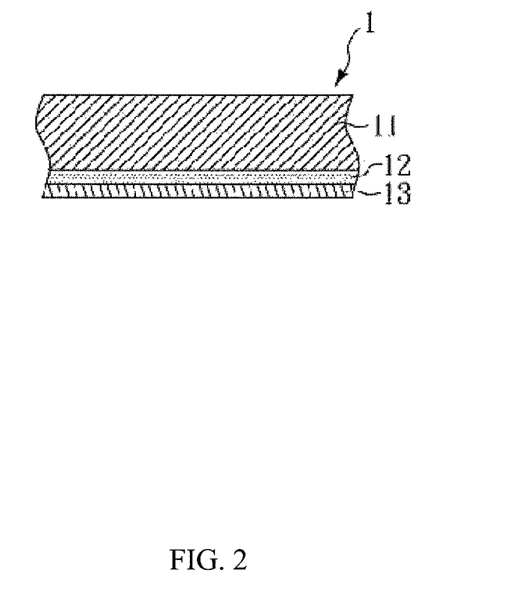
FIG. 2 illustrates a schematic drawing of the method for fabricating a heat dissipation substrate in one embodiment of the present invention.

As shown in FIG. 2, the substrate 1 comprises a metal layer 11, an insulation layer 12, and a first conductive layer 13. The insulation layer 12 is positioned between the metal layer 11 and the first conductive layer 13, and the metal layer 11 is thicker than the first conductive layer 13.

In one embodiment of the present invention, the metal layer 11 and the first conductive layer 13 are made of copper or copper alloy, but the present invention is not limited to that design. The insulation layer 12 is made of polypropylene or resin (such as epoxy resin), but the present invention is not limited to that design.

In one embodiment of the present invention, the thickness of the metal layer 11 is substantially between 38 and 65 micrometers, the thickness of the insulation layer 12 is substantially between 5 and 25 micrometers, and the thickness of the first conductive layer 13 is substantially between 10 and 38 micrometers. However, the present invention is not limited to that design.

In one preferred embodiment of the present invention, the thickness of the metal layer 11 is substantially between 40 and 60 micrometers, the thickness of the insulation layer 12 is substantially between 8 and 20 micrometers, and the thickness of the first conductive layer 13 is substantially between 12 and 35 micrometers. However, the present invention is not limited to that design.

Figure 3:
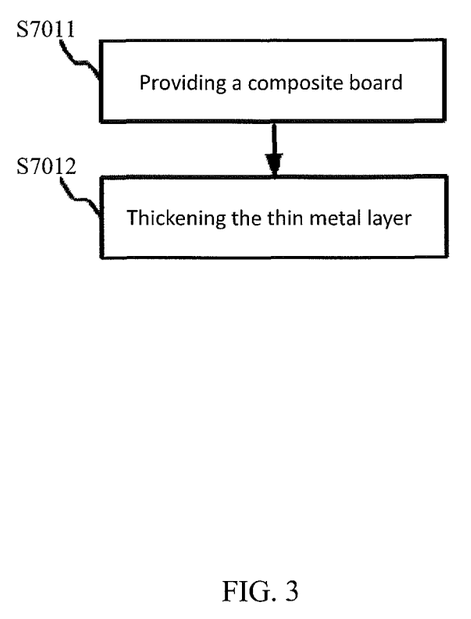
FIG. 3 illustrates a flowchart of the method for fabricating a substrate in one embodiment of the present invention.

As shown in FIG. 3, there is another method for fabricating a substrate 1 of the present invention; first, execute Step S7011: providing a composite board.

Figure 4:
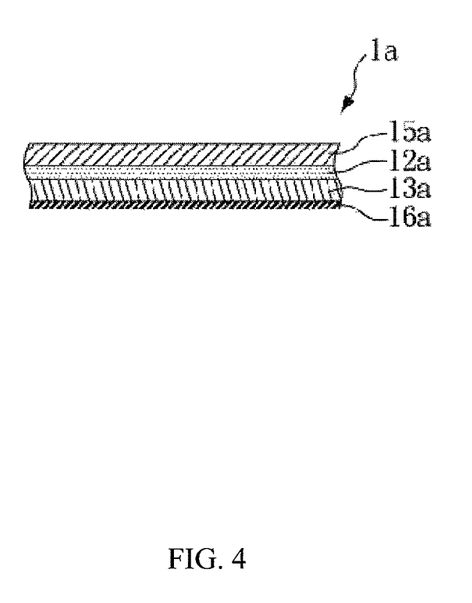
FIG. 4 illustrates a schematic drawing of the method for fabricating a substrate in one embodiment of the present invention.

As shown, in FIG. 4, the composite board 1a comprises a thin metal layer 15a, the insulation layer 12a, and the first conductive layer 13a. The insulation layer 12a is positioned between the thin metal layer 15a and the first conductive layer 13a, and the thickness of the thin metal layer 15a is equal substantially to the thickness of the first conductive layer 13a. However, the present invention is not limited to that design. In one embodiment of the present invention, the composite board 1a further comprises a dry film 16a. The dry film 16a is pasted on the other face of the first conductive layer 13a, for preventing the metal (such as copper) from being electroplated on the first conductive layer 13a in the following electroplating process.

In one embodiment of the present invention, the thin metal layer 15a is made of copper or copper alloy, and the insulation layer 12a is made of polypropylene or resin (such as epoxy resin). However, the present invention is not limited to the design.

Then execute Step S7012: thickening the thin metal layer.

In one embodiment of the present invention, the metal (such as copper) is electroplated on the thin metal layer 15a via an electroplating process, and to control the thickness of the thin metal layer 15a to meet the requirement, the dry film 16a is removed. Therefore, as shown in FIG. 2, the thin metal layer 15a becomes thicker to form the metal layer 11, and the composite board 1a becomes the substrate 1.

Figure 5:
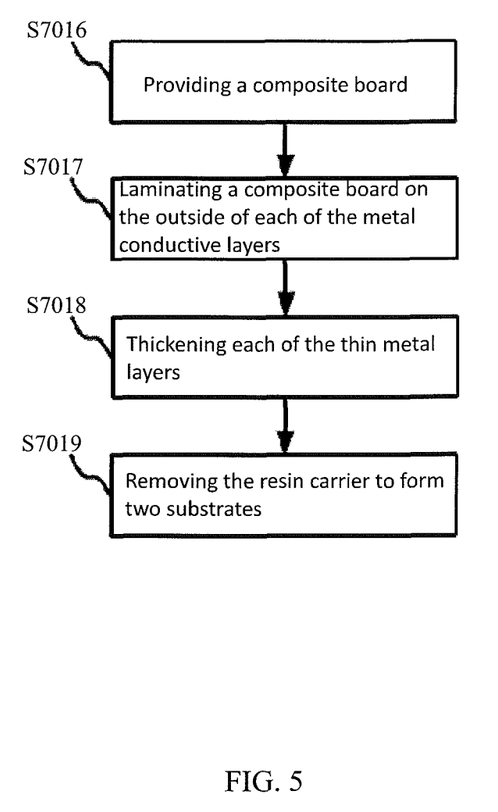
FIG. 5 illustrates a flowchart of the method for fabricating a substrate in another embodiment of the present invention.

As shown in FIG. 5, there is another method for fabricating a substrate 1 of the present invention; first, execute Step S7016: providing a composite board.

Figure 6:
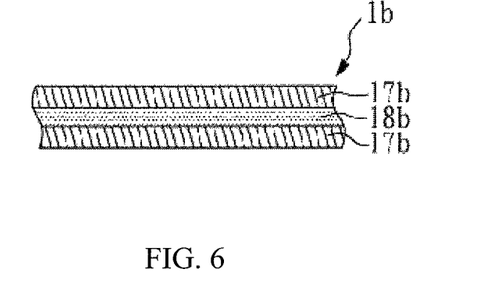
FIG. 6 to FIG. 7 illustrates the schematic drawings of the method for fabricating a substrate in another embodiment of the present invention.

As shown in FIG. 6, the composite board 1b comprises two metal conductive layers 17b and a resin carrier 18b. The resin carrier 18b is positioned between each of the metal conductive layers 17b. In another embodiment of the present invention, two films (not shown in FIG.), which can be removed easily, are pasted respectively between the resin carrier 18b and each of the metal conductive layers 17b, such that after the following steps, the resin carrier 18b and the metal conductive layers 17b can be separated easily by an external force.

In one embodiment of the present invention, the metal conductive layers 17b are made of copper or copper alloy, and the resin carrier 18b is made of polypropylene or resin. However, the present invention is not limited to the design.

Then execute Step S7017: laminating a composite board on the outside of each of the metal conductive layers.

Figure 7:
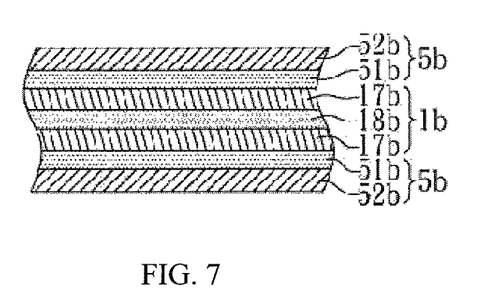

As shown in FIG. 7, a composite board 5b is laminated on the outer surface of each of the metal conductive layers 17b. The composite board 5b comprises the insulation layer 51b and the thin metal layer 52b, and each insulation layer 51b is connected to each metal conductive layer 17b. In one embodiment of the present invention, the thin metal layer 52b is made of copper or copper alloy, and the insulation layer 51b is made of polypropylene or resin. However, the present invention is not limited to the design.

Then execute Step S7018: thickening each of the thin metal layers.

A metal (such as copper) is electroplated on the thin metal layer 52b via the electroplating process, and the thickness of the thin metal layer 52b can be controlled to meet the requirement (not shown in FIG.).

Then execute Step S7019: removing the resin carrier to form two substrates.

As shown in FIG. 2, each metal conductive layer 17b is separated from the resin carrier 18b. Therefore, each metal conductive layer 17b becomes the first conductive layer 13, the insulation layer 51b becomes the insulation layer 12, and the thin metal layer 52b, which increases the thickness, becomes the metal layer 11, such that two substrates 1 are formed. It is to be understood that, when two films (not shown in FIG.), which can be removed easily, are pasted respectively between the resin carrier 18b, and each of the metal conductive layers 17b, the resin carrier 18b and the metal conductive layers 17b can be separated easily by an external force.

Please continue to refer FIG. 1; the method proceeds to Step S702 of the method for fabricating a heat dissipation substrate: removing part of the metal layer to form a metal bulk.

Figure 8:
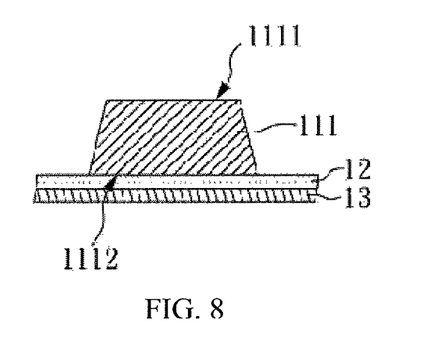
FIG. 8 to FIG. 13 illustrates the schematic drawings of the method for fabricating a heat dissipation substrate in one embodiment of the present invention.

As shown in FIG. 8, part of the metal layer 11 is removed to form the metal bulk 111 in Step S702. In one embodiment of the present invention, the method of removing part of the metal layer 11 comprises lithography and etching. The metal bulk 111 comprises an upper surface 1111 and a lower surface 1112. The lower surface 1112 is connected to the insulation layer 12, and the area of the lower surface 1112 is larger than the area of the upper surface 1111. In one embodiment of the present invention, the ratio value range of the area of the upper surface 1111 to the area of the lower surface 1112 is substantially between 25% and 95%. However, the present invention is not limited to that design. It is to be understood that the metal bulk 111 comprises a declining side face, but the shape of the metal bulk 111 of the present invention is not limited to that shown in FIG. 8.

Execute Step S703: providing an adhesive layer.

Figure 9:
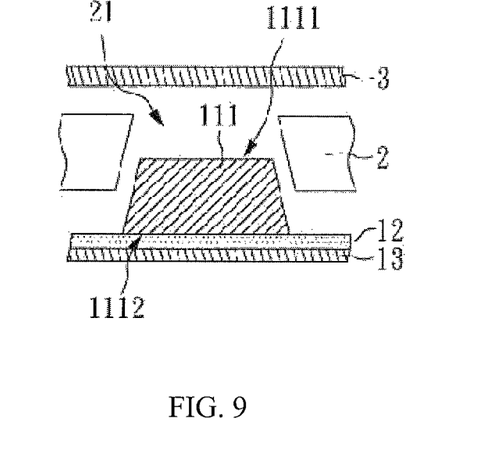

As shown in FIG. 9, the adhesive layer 2 comprises an opening 21. In one embodiment of the present invention, the material of the adhesive layer 2 is polypropene or resin. The opening 21 can be formed by the mechanical cutting method, such as routing, punching, or laser ablation, but the present invention is not limited to that design. It is to be understood that the shape and the position of the opening 21 correspond to the metal bulk 111.

Execute Step S704: providing a second conductive layer.

As shown in FIG. 9, in one embodiment of the present invention, the second conductive layer is made of copper or copper alloy, but the present invention is not limited to that design.

Execute Step S705: laminating the second conductive layer, the adhesive layer, and the substrate.

Figure 10:
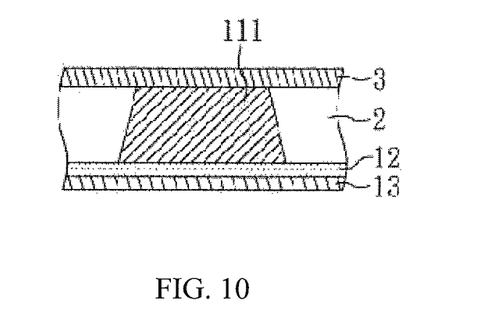

Please refer to FIG. 9; the second conductive layer, the adhesive layer, and the substrate are laminated in sequence. The adhesive layer 2 is positioned above the substrate 1, the second conductive layer 3 is above the adhesive layer 2, and the metal bulk 111 is blended with the opening 21 (as shown in FIG. 10). The metal bulk 111 comprises a declining side face, allowing the area of the lower surface 1112 to be larger than the area of the upper surface 1111, such that the metal bulk 111 can be blended with the opening 21 smoothly.

Execute Step S706: forming a hole in the insulation layer and the first conductive layer.

Figure 11:
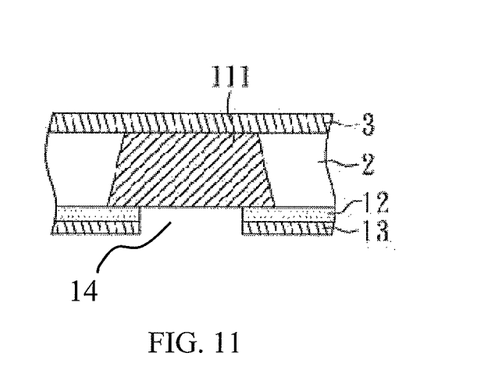

As shown in FIG. 11, a hole 14 is formed in the insulation layer 12 and the first conductive layer 13. The hole 14 is positioned under the metal bulk 111, and part of the lower surface 1112 is exposed. In one embodiment of the present invention, the method of forming the hole 14 on the insulation layer 12 and the first conductive layer 13 is Laser Direct Imaging, but the present invention is not limited to that design.

Finally, execute Step S707: at least forming a third conductive layer in the hole.

Figure 12:
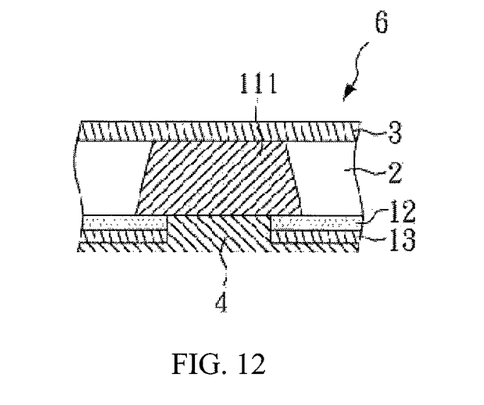
Figure 13:
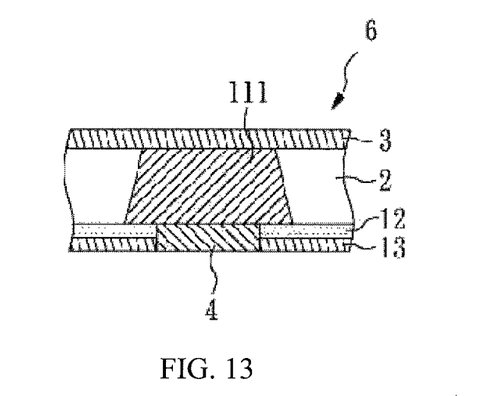

As shown in FIG. 12, the third conductive layer 4 is formed in the hole 14, allowing the third conductive layer 4 to be electrically connected to the first conductive layer 13, such that the heat dissipation substrate 6 of the present invention is completed. In one embodiment of the present invention, the method of forming the third conductive layer 4 in the hole 14 is an electroplating process. The electroplating process can be started from the bottom of the metal bulk 111. The forming range of the third conductive layer 4, which depends on the requirement, can be expanded over the first conductive layer 13, or the third conductive layer 4 can be restricted only to the opening 14 (as shown in FIG. 13). However, the present invention is not limited in the design. In one embodiment of the present invention, the third conductive layer 4 is made of copper or copper alloy, but the present invention is not limited to that design.

Figure 14:
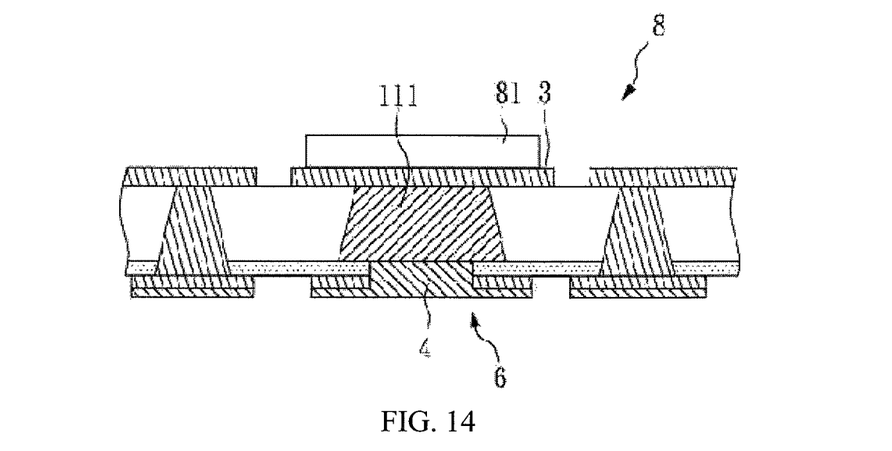
FIG. 14 illustrates a schematic drawing of the heat dissipation substrate applied to a chip package carrier in one embodiment of the present invention.

Please refer to FIG. 14, which illustrates a schematic drawing of the heat dissipation substrate applied to a chip package carrier in one embodiment of the present invention.

As shown in FIG. 14, the chip package carrier 8 comprises the heating element 81 and the heat dissipation substrate 6. The heating element 81 is located on the heat dissipation substrate 6 and connected to the second conductive layer 3. When the heating element 81 generates heat in operation, the heat can be delivered to the third conductive layer 4 via the second conductive layer 3 and the metal bulk 111, and the third conductive layer 4 can be connected to a cooling device for forming a heat dissipation structure. Therefore, the heat generated by the heating element 81 can be delivered effectively to the heat dissipation structure via the heat dissipation substrate 6. In one embodiment of the present invention, the heating element 81 is a Light-Emitting Diode mode, but the present invention is not limited to that application. For example, the heating element 81 can be other chips, chip package bodies, or passive elements (such as a capacitor, a inductor, or a resistor).

Due to the method for fabricating a heat dissipation substrate, there is no need to perform mechanical treatments on the heat dissipation lump in advance as in the prior art, reducing the cost of the heat dissipation lump. In addition, the only step requiring alignment is Step S705. So, errors in alignment can be reduced.

It is noted that the above-mentioned embodiments are only for illustration. It is intended that the present invention cover modifications and variations of this invention provided they fall within the scope of the following claims and their equivalents. Therefore, it will be apparent to those skilled in the art that various modifications and variations can be made to the structure of the present invention without departing from the scope or spirit of the invention.

What is claimed is:

1. A method for fabricating a heat dissipation substrate comprising:
   providing a first composite board, wherein the first composite board comprises two metal conductive layers and a resin carrier, wherein the resin carrier is positioned between the two metal conductive layers;
   laminating second and third composite boards outside the two metal conductive layers, wherein each of the second and third composite boards comprises an insulation layer and a thin metal layer, wherein the insulation layers are positioned between the two metal conductive layers and the thin metal layers of the second and third composite boards;
   thickening each of the thin metal layers; and
   removing the resin carrier for forming first and second substrates, wherein each of said metal conductive layer forms a first conductive layer and each of said thin metal layers becomes thicker to form a metal layer in each of the first and second substrates, and wherein the metal layer is thicker than the first conductive layer in each of the first and second substrates; and
   in each of the first and second substrates, removing part of the metal layer for forming a metal bulk;
   providing an adhesive layer, wherein the adhesive layer comprises an opening, and wherein the opening corresponds to the metal bulk;
   providing a second conductive layer;
   laminating the second conductive layer, the adhesive layer, and the substrate, wherein the adhesive layer is positioned above the substrate, and wherein the second conductive layer is above the adhesive layer;
   forming a hole in the insulation layer and the first conductive layer, wherein the hole is positioned under the metal bulk; and
   forming a third conductive layer in the hole.

2. The method for fabricating the heat dissipation substrate as claimed in claim 1, wherein the thickness of the metal layer is between 38 and 65 micrometers.

3. The method for fabricating the heat dissipation substrate as claimed in claim 1, wherein the thickness of the insulation layer is between 5 and 25 micrometers.

4. The method for fabricating the heat dissipation substrate as claimed in claim 1, wherein the thickness of the first conductive layer is between 10 and 38 micrometers.

5. The method for fabricating the heat dissipation substrate as claimed in claim 1, wherein a material of the insulation layer comprises polypropene or resin.

6. The method for fabricating the heat dissipation substrate as claimed in claim 1, wherein a material of the adhesive layer comprises polypropene or resin.

7. The method for fabricating the heat dissipation substrate as claimed in claim 1, wherein the metal bulk comprises an upper surface and a lower surface; wherein the lower surface is connected to the insulation layer, and wherein an area of the lower surface is larger than an area of the upper surface.

8. The method for fabricating the heat dissipation substrate as claimed in claim 7, wherein a ratio value range of the area of the upper surface to the area of the lower surface is substantially between 25% and 95%.

9. The method for fabricating the heat dissipation substrate as claimed in claim 1, wherein removing part of the metal layer comprises lithography and etching.

10. The method for fabricating the heat dissipation substrate as claimed in claim 1, wherein forming the third conductive layer in the hole comprises chemical plating or electroplating.

* * * * *